(12) United States Patent
Hulseman et al.

(10) Patent No.: US 9,120,670 B2
(45) Date of Patent: Sep. 1, 2015

(54) SYSTEM AND METHOD FOR EXTRUDING PARTS HAVING MICROSTRUCTURES

(75) Inventors: Ralph A Hulseman, Greenville, SC (US); Andrew H. Cannon, Columbia, SC (US); William P. King, Champaign, IL (US); March Maguire, Clemson, SC (US)

(73) Assignee: Hoowaki, LLC, Pendleton, SC (US)

(*) Notice: Subject to any disclaimer, the term of this patent is extended or adjusted under 35 U.S.C. 154(b) by 663 days.

(21) Appl. No.: 13/404,707

(22) Filed: Feb. 24, 2012

(65) Prior Publication Data
US 2012/0223451 A1  Sep. 6, 2012

Related U.S. Application Data

(60) Provisional application No. 61/446,180, filed on Feb. 24, 2011.

(51) Int. Cl.
*B29C 53/00* (2006.01)
*B81C 99/00* (2010.01)
*B29C 47/00* (2006.01)
*B29L 31/00* (2006.01)
*B29C 55/22* (2006.01)

(52) U.S. Cl.
CPC ........... *B81C 99/0015* (2013.01); *B29C 47/003* (2013.01); *B29C 47/0021* (2013.01); *B29C 47/0023* (2013.01); *B29C 55/22* (2013.01); *B29L 2031/756* (2013.01)

(58) Field of Classification Search
CPC .......................... B29C 47/8815; B29C 47/003
USPC .......................................... 264/177.17, 177.1
See application file for complete search history.

(56) References Cited

U.S. PATENT DOCUMENTS 4,753,762 A * 6/1988 Li et al. ......................... 264/54
5,200,248 A * 4/1993 Thompson et al. ........... 428/131

* cited by examiner

*Primary Examiner* — Galen Hauth
(74) *Attorney, Agent, or Firm* — McNair Law Firm, P.A.; Douglas W. Kim

(57) ABSTRACT

A manufacturing apparatus for manufacturing extruded parts having microstructures comprising: a support structure; a hopper carried by the support structure for receiving feedstock; an extrusion chamber operatively associated with the hopper for receiving the feedstock from the hopper and melting the feedstock above a feedstock melting temperature; a die carried by the support structure having die microstructures disposed on an inner surface of the die, the die microstructures having a plurality of microfeatures each having an upper surface and a lower surface, the melted feedstock being forced through the die to produce an extrudate having extrudate microstructures; and, a cooling assembly wherein the extrudate microstructures of the pre-cooled extrudate have larger physical dimensions than that of the extrudate microstructures of the cooled extrudate.

26 Claims, 20 Drawing Sheets

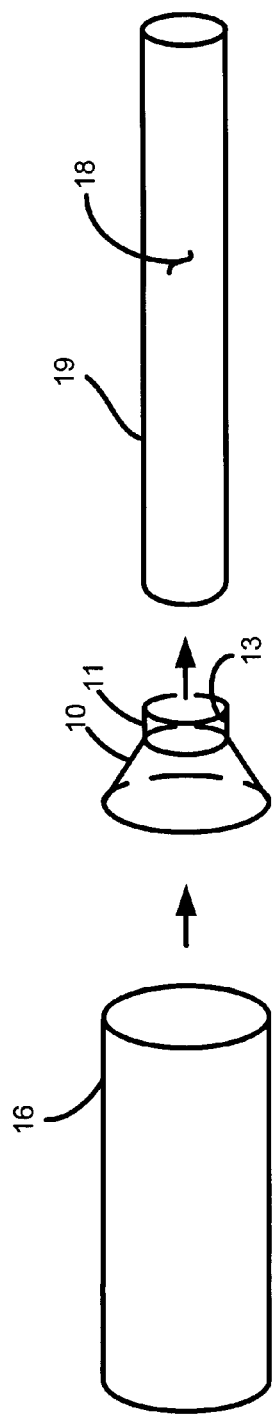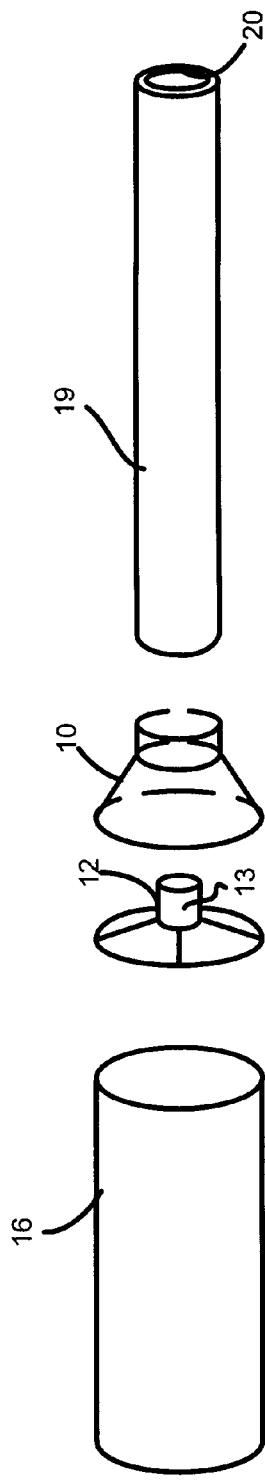

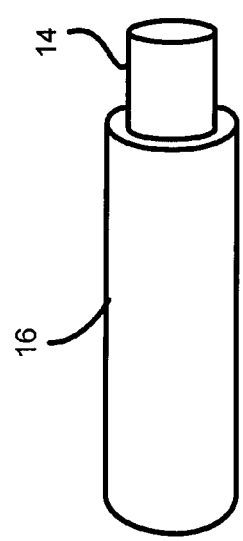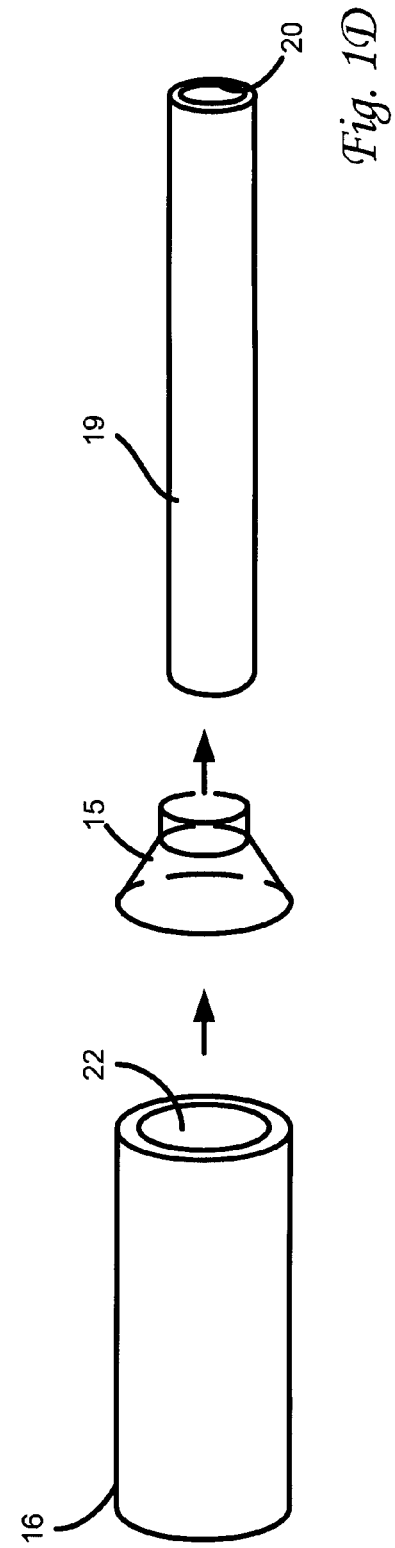

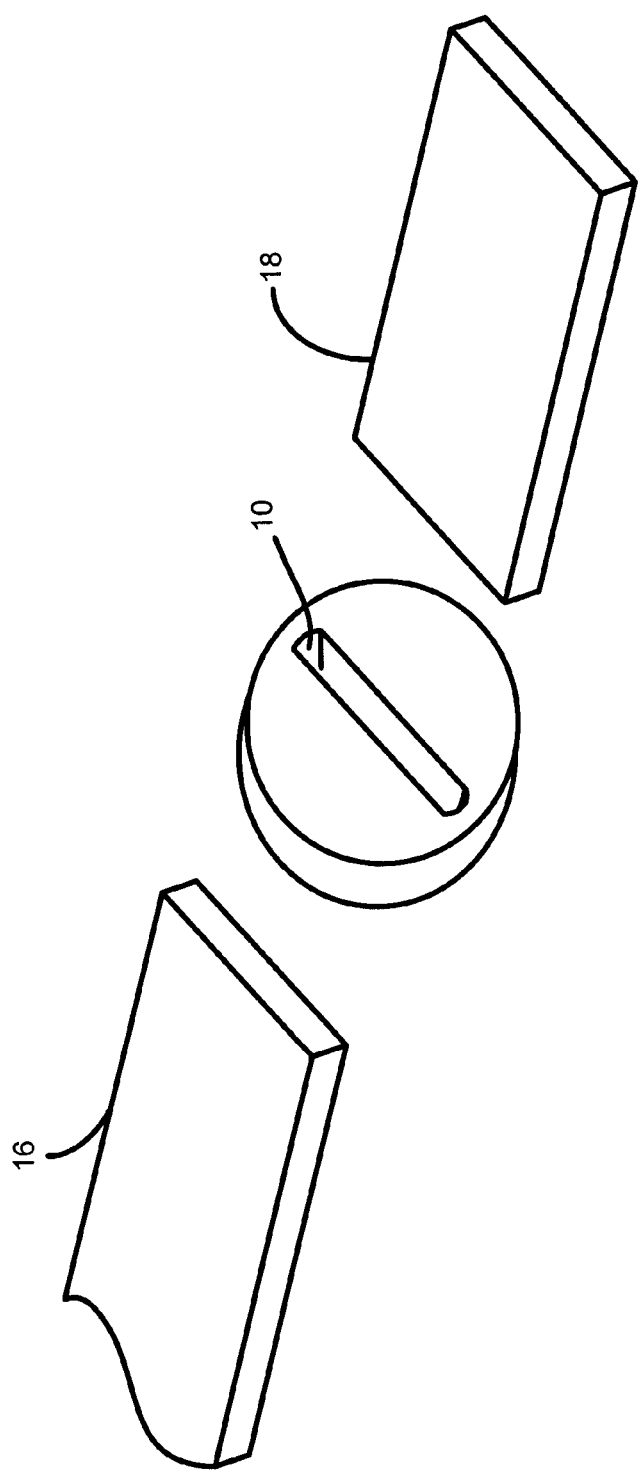

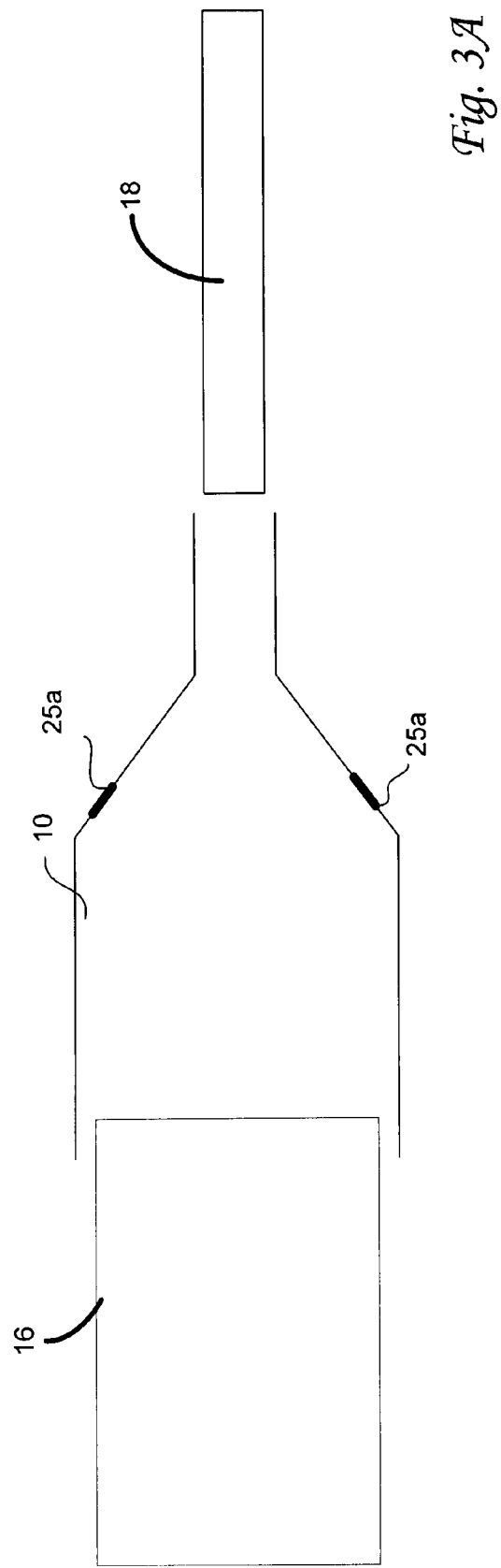

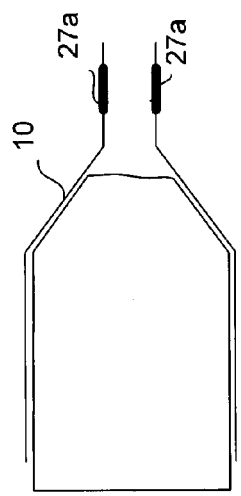
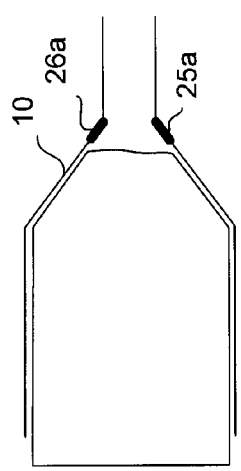
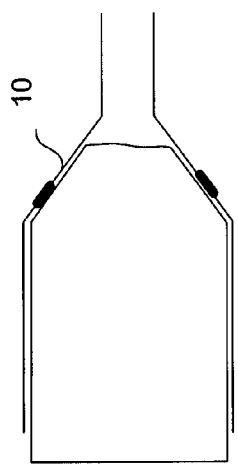
Fig. 3B

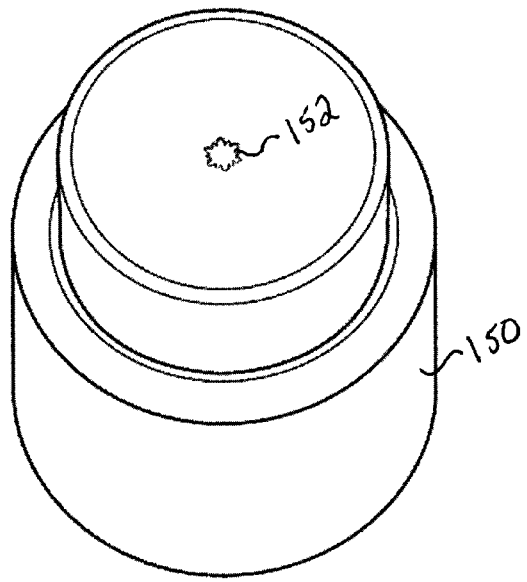
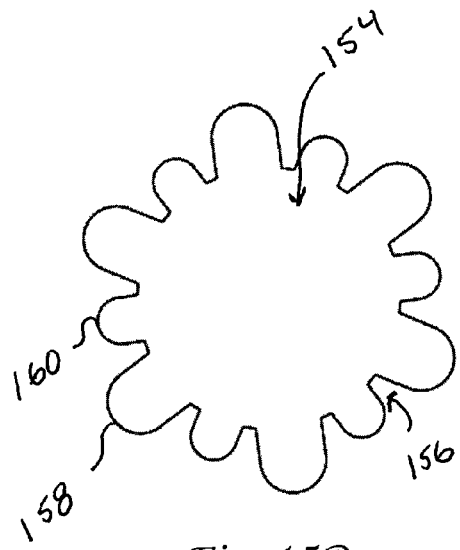
Fig. 15A    Fig. 15B
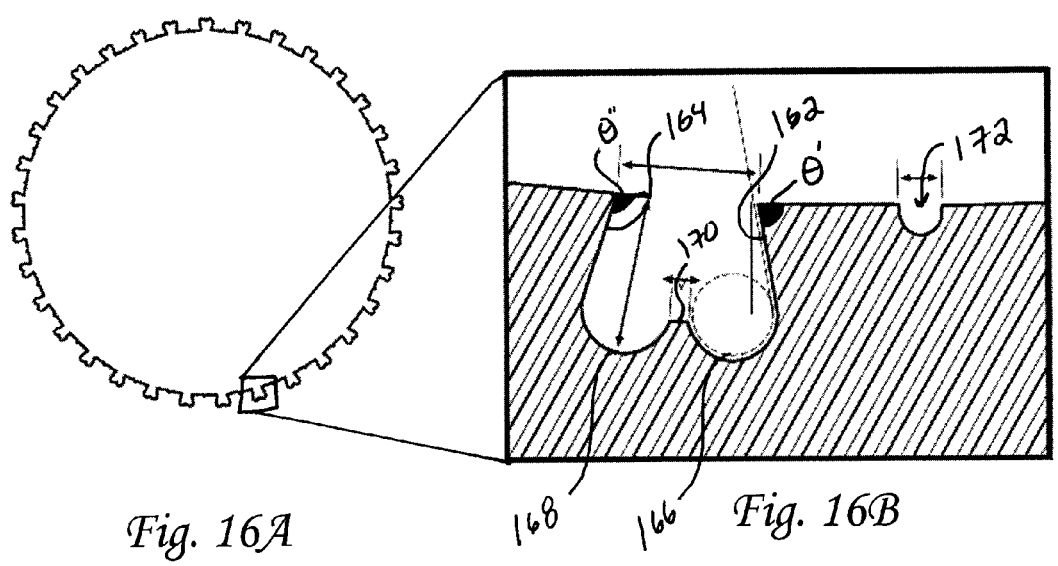
Fig. 16A    Fig. 16B

SYSTEM AND METHOD FOR EXTRUDING PARTS HAVING MICROSTRUCTURES

CLAIM OF PRIORITY

This application claims priority on U.S. Provisional Patent Application Ser. No. 61/446,180, filed Feb. 24, 2011.

BACKGROUND OF THE INVENTION

1) Field of the Invention

This invention is directed to a system and method of making parts and more specifically, a system and method of making parts using the manufacturing process of extrusion wherein the resulting parts have microstructures imparted on their surface.

2) Description of the Related Art

Extrusion is a manufacturing process that is used to create parts having a fixed cross-sectional profile. Extrusion material is pushed or drawn through an extrusion or drawings die of a desired cross-section. Extrusion can be used with extrusion material that is brittle since the extrusion material only encounters compressive and shear stresses. Extrusion also can produce finished parts with surface finish.

Extrusion may be a continuous process which can theoretically produce indefinitely long parts. In one form, extrusion produces semi-continuous parts resulting in a replication of virtually identical parts or parts having the same cross-section, but varying lengths. The extrusion process can be done with extrusion material that is hot or cold. Commonly extruded materials include metals, polymers, plastics, ceramics, concrete and foodstuffs.

Solid parts can be produced with a simply flat extrusion die. Hollow cavities within parts can be produced with a die having depth, beginning first with a shape profile that supports the center section. The die shape then internally changes along its length into the final shape, with the suspended center pieces supported from the back of the die. Mandrels can also be used to produce extruded parts having cavities.

Parts can also be effected by the drawings process. Drawing is a manufacturing process which uses tensile forces to stretch material. Generally, drawings is described as sheet drawing or wire, bar, and tube drawing. Sheet drawing involves deformation over a curved axis. Wire, bar, and tube drawing pulls material through a drawings die to reduce its diameter and increase its length. Drawing is usually done at room temperature, thus classified a cold working process, however it may be performed at elevated temperatures to hot work large wires, rods or hollow sections in order to reduce forces. Drawings can be used for metals and non-metals.

Under the current state of the art, the extrusion process (which includes drawing), generally produces a surface with a smooth or fine finish. It would be advantageous to be able to impart surface properties onto extrusion material during the extrusion process which results in the parts resulting from the extrusion process having certain physical properties.

Microfeatures placed on a part can provide for advantageous surface properties. By including a plurality of microfeatures on the surface of an object, other characteristics may be imparted to the object, such as increased hydrophobicity, hydrophilicity, self-cleaning ability, hydro-dynamics drag coefficients, aerodynamic drag coefficients, frictional properties, and optical effects. Superhydrophobic surfaces were first inspired by the characteristic water repellency of the lotus leaf.

Historically, microfeatures were applied to surfaces as coating, adhesive or chemical reaction and therefore are prone to wear off the surface. Over time the properties provided by the microstructures are lost. Further, the applications of a coating or adhesive would have to be added to the extrusion process and would not naturally be integrated into the extrusion process.

The information contained in PCT Patent Application: US09/43306, "Method of Manufacturing Microstructures", filed on May 8, 2009; PCT Patent Application: US09/43307, "Flexible Microstructured Superhydrophobic Materials", filed on May 8, 2009 and PCT Patent Application: US09/49565, "Casting Microstructures into Stiff and Durable Materials from a Flexible and Reusable Mold", filed on Jul. 2, 2009 are incorporated by reference.

Therefore, it is an object of this invention to provide a manufacturing method for manufacturing parts using the extrusion process that resulted in parts having microfeatures.

It is another object of this invention to provide an extrusion die which results in parts having microfeatures imparting certain physical properties to the manufactured part even when drawing.

It is another object of this invention to provide an extrusion die that has microfeatures on its surface, such that these microfeatures are imparted on a resulting part thereby affecting the performance or properties of the extruded part.

SUMMARY OF THE INVENTION

The objects above are achieved by providing a manufacturing apparatus, and a method, for manufacturing extruded parts having microstructures comprising: a support structure; a hopper carried by said support structure for receiving feedstock; an extrusion chamber operatively associated with said hopper for receiving said feedstock from said hopper and melting said feedstock above a feedstock melting temperature; a die carried by said support structure having die microstructures disposed on an inner surface of said die, said die microstructures having a plurality of microfeatures each having an upper surface and a lower surface, said melted feedstock being forced through said die to produce an extrudate having extrudate microstructures; and, a cooling assembly wherein said extrudate microstructures of said pre-cooled extrudate have larger physical dimensions than that of said extrudate microstructures of said cooled extrudate.

The invention can result in extrudate having a physical shape taken from the group consisting of a film, a square column, rectangular column, trapezoidal column, asymmetrical column, circular column, oval column, triangular column and any combination of these. A take up roller can be included for gathering said cooled extrudate wherein said extrudate microstructures of said pre-gathered extrudate have larger physical dimensions than that of said extrudate microstructures of said gathered extrudate. A post extrusion assembly can be included for physically altering said extrudate in a manner taken from the group consisting of: drawing down, flattening, stretching, embossing, coating, stamping, rolling, spiraling, heating, freezing and any combination of these; and, wherein said extrudate microstructures of said extrudate have larger physical dimensions than that of said extrudate microstructures of said extrudate after said extrudate passes through said post extrusion assembly.

The invention can include a die having a planar surface; and, an arc included in said lower surface of at least one microfeature disposed on said planar surface. Also a first wall can be included in at least one microfeature disposed on said planar surface having an angle of incident less than 90° in relation to said upper surface. A microfeature planar surface can be included in said microfeature disposed along said lower surface with a second arc included in said microfeature disposed adjacent to said microfeature planar surface; and, a second wall included in microfeature having an angle of incident greater than 90° in relation to said upper surface. An upper arc can be included in said upper surface and a channel can be defined by said microfeature having a width between 100 and 160 μm and a depth between 300 and 400 μm.

The invention can include a curved surface in said die having microfeatures; a channel defined in at least one microfeature included in said curved surface; and, an arc defined in said lower surface of said microfeature included in said curved surface. A second arc can be defined in said lower surface and can be disposed adjacent to said arc. A first wall can be included in said microfeature having an angle of incident less than 90° in relation to said upper surface and a second wall can be included in said microfeature having an angle of incident greater less than 90° in relation to said upper surface.

A mandrel can be carried by said support structure having microstructures deposed on an outer surface so that said extrudate will include an interior cavity having microstructures on an inner surface of said interior cavity.

The extrudate microstructures can include physical characteristics selected from the group consisting of: hydrophobicity, hydrophilicity, self-cleaning, decreased or increased hydro-dynamic drag coefficients, decreased or increased aerodynamic drag coefficients, increased friction, reduced friction, optical effects, increased adhesion, decreased adhesion, oleophobicity, oleophillicity, tactile effects, anti-blocking and any combination of these. The extrudate microstructures can be selected from the group consisting of: pillers, voids, steps, ridges, curved regions, recessed regions, columns, cross-section shapes comprising circles, ellipses, triangles, squares, rectangles, poly ions, stars, hexagons, letters, numbers, symbols, and any combination of these. An overhang structure can be included in said die microstructures.

The invention also includes a method of manufacturing an extruded item by an extrusion manufacturing process comprising the steps of: providing an extrusion feedstock; providing an extrusion die having microstructures disposed on an interior surface of said die, said die having a plurality of microfeatures having a depth about between 0.1 and 500 μm wherein each of said microfeatures includes an upper surface and a lower surface; and, creating an extrudate having extrudate microfeatures by forcing said feedstock through said extrusion die so that said extrudate includes physical properties selected from the group consisting of: hydrophobicity, hydrophilicity, self-cleaning, decreased or increased hydro-dynamic drag coefficients, decreased or increased aerodynamic drag coefficients, increased friction, reduced friction, optical effects, increased adhesion, decreased adhesion, oleophobicity, oleophillicity, tactile effects, anti-blocking and any combination of these.

BRIEF DESCRIPTION OF THE DRAWINGS

The description of the invention will be explained with reference to the following figures:

FIGS. 1A through 1D are perspective views of aspects of the invention;

FIG. 2 is a perspective view of aspects of the invention;

FIG. 3A through 3C are side views of aspects of the invention;

FIG. 15A is a perspective of aspects of the invention;

FIG. 15B is a cross section of aspects of the invention;

FIG. 16A is a cross section of aspects of the invention;

FIG. 16B is a elevation of a portion of the aspects of the invention;

DETAILED DESCRIPTION OF THE INVENTION

Figure 3C:
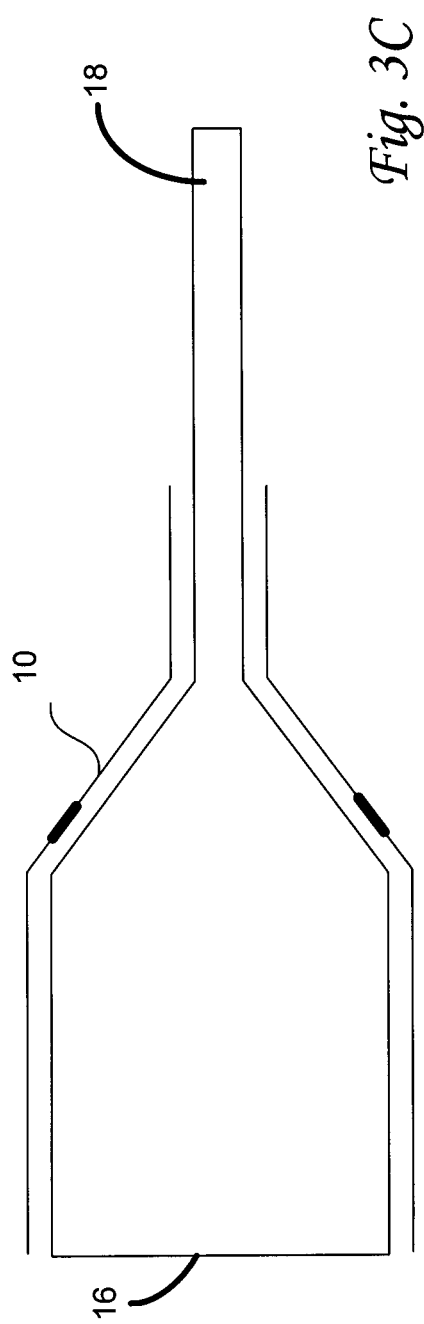

In general the terms and phrases used herein have their art-recognized meaning, which can be found by reference to standard texts, journal references and contexts known to those skilled in the art. Referring to FIG. 1, extrusion material (also called feed stock, a blank or a billet) 16 is pressed through die 10 resulting in an extruded part 18. The die can be made by a number of manufacturing processes including molding, forming and electric discharging machining.

Microstructures can be imparted to the surface of metal dies with subtractive methods such as direct machining, cutting, or scoring, or laser machining; additive methods such as spraying, coating, or inserts incorporated onto the die surface; and surface alteration methods that neither add nor subtract such as micro molding the metal die surface.

Microstructures can be imparted to the surface of polymer dies with subtractive methods such as direct machining, cutting, or scoring, or laser machining; additive methods such as spraying, coating, or inserts incorporated onto the die surface; and surface alteration methods that neither add nor subtract such as micro molding the metal die surface. Polymer dies can also be molded, and microstructures can be imparted via the mold. A common polymer die material is ultem. The microstructured molded polymer die can be machined after molding.

Microstructures can be imparted to the surface of ceramic dies with subtractive methods such as direct machining, cutting, scoring, or laser machining; additive methods such as spraying, coating, or inserts incorporated onto the die surface. Ceramic dies can also be molded, and microstructures can be imparted via the mold. The microstructured molded ceramic die can be machined after micromolding.

Extrusion dies can be manufactured or have microstructures applied to them as indicated in the PCT application referenced above. Dies can include a single outlet opening or multiple outlet openings. Further, the die can be a single part or an assembly of parts. The die material can be metal, polymer or ceramic. Common die materials include steel, aluminum, and titanium.

Included in the die is an outlet die member 11 having an outlet contact surface 13 forming an outer surface of the resulting part. In one embodiment, the diameter of the blank is reduced though the extrusion process. As shown, die 10 contacts the blank on an outer surface 19 of the resulting part 18. In the event that the resulting part needs to include a cavity, a mandrel 12 can be included in the die which forms the cavity within the blank. Mandrel 12 can include a mandrel contact surface 13 which forms an inner surface of the resulting part. Dies capable of forming extruded parts having cavities include spider dies, porthole dies or bridge dies.

Extrusion material can be metal or non-metal and can include rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin and other flexible polymers known to those of skill in the art.

Microstructures are included on the outlet contact surface. Microfeatures can include holes, pillars, steps, ridges, curved regions, recessed regions, raised regions, and any combination of these employing any cross-sectional shape including circles, ellipses, triangles, squares, rectangles, polygons, stars, hexagons, letters, numbers, mathematical symbols and any combination of these.

When the extrusion material comes in contact with microstructures on the die, microstructures are imparted on the surface of the resulting part. These microstructures can increase hydrophobicity to the part, decrease hydrophobicity to the part and/or give the part a self-cleaning ability. The microfeatures can also impart optical effects, for example giving an object a prismatic effect, a specific color, or a directional dependent color change or color flop (e.g. the object appears a specific color when viewed from one angle and another color when viewed from another direction).

The microfeatures can also impart a surface friction or grip to the part, or can give an object a specific tactile sensation such as feeling fuzzy, rough or squishy when touched. In a specific embodiment, the microfeatures can modify the heat transfer characteristics of an object, for example by changing the surface area of an object, changing how the surface interacts with fluids, or changing the behavior of nucleation sites. In a specific embodiment, the microfeatures can result in a decreased heat transfer by conduction, for example when the microfeatures have a high aspect ratio only the tops of the microfeatures will be in contact with another object for conductive heat transfer while the voids between surface features will not transfer heat well. Further, the surface of the resulting part can include microstructures that include "drainage" abilities allowing fluids to drain from the part surface. Further, the microstructures can provide for a capillary action allowing fluid to flow against gravity. Friction can also be modified by particular microstructures imparted to the surface of the results part.

Microstructures can also be electrically conductive, for example metal microstructures or microstructures comprised of an electrically conductive polymers. These types of electrically conductive microstructures are useful, for example, as an array of electrical leads for electronic devices. The electrically conductive microstructures, for example, can be embossed directly onto the surface of an object. In some circumstances, the microstructures on the surface of the extrudate can mirror the microstructures on the die or mandrel. In other circumstances, the microstructures on the extrudate can be of a different size or shape. Extrudate drawing, stretching, or other manipulations can change the shape of the microstructures, for example, shrinking the microstructures down in size by an order of magnitude or more.

In a specific embodiment, the microfeatures have dimensions selected over the range of 10 nm to 1000 µm. In an embodiment, for example, the microfeatures have a length, height, diameter, and/or width selected over the range of 10 nm to 1000 µm, preferably for some embodiments selected over the range of 10 nm to 100 µm. In an embodiment, for example, a pitch between microfeatures is selected over the range of 10 nm to 1000 µm, for some applications selected over the range of 1 µm to 1000 µm, and for some applications selected over the range of 10 µm to 1000 µm.

In one embodiment, a preselected pattern of microfeatures includes a region of microfeatures having a first cross sectional shape and a region of microfeatures having a second cross sectional shape, for example different from the first cross sectional shape. In one embodiment, a preselected pattern of microfeatures includes a region of microfeatures having multiple cross sectional shapes and/or sizes. In an embodiment, a preselected pattern of microfeatures refers to two or more arrays of microfeatures of two or more cross-sectional shapes and/or sizes. In a specific embodiment, the two or more arrays are positioned side by side; that is, where the two arrays do not overlap. In another specific embodiment, the two or more arrays are positioned to overlap, and microfeatures having the two or more cross sectional shapes and/or sizes are interspersed within the overlapping arrays.

In an embodiment, a preselected pattern of microfeatures includes multiple dimensions of microfeatures, for example a bimodal or multimodal distribution of dimensions. The size distribution could also be random, or the size could correspond to the location of the microfeature on the mandrel or die. In an exemplary embodiment, a preselected pattern of microfeatures includes a first group of microfeatures having dimensions selected from 10 nm to 1 µm and a second group of microfeatures having dimensions selected from 1 µm to 100 µm. In a specific embodiment, the sizes, shapes and positions of the microfeatures are preselected with micrometer-scale or nanometer-scale accuracy and/or precision.

In an embodiment, the microstructured surface comprises a polymer. Useful polymers include, but are not limited to: PDMS, PMMA, PTFE, FEP, PEEK, polyurethanes, Teflon, polyacrylates, polyarylates, thermoplastics, thermoplastic elastomers, fluoropolymers, biodegradable polymers, polycarbonates, polyethylenes, polyimides, polystyrenes, polyvinyls, polyoelefins, silicones, natural rubbers, synthetic rubbers and any combination of these.

In an embodiment, the microstructured surface comprises a metal. Useful metals include any moldable, castable, embossable and/or stampable metal or alloy. Useful metals include, but are not limited to: aluminum, aluminum alloys, bismuth, bismuth alloys, tin, tin alloys, lead, lead alloys, titanium, titanium alloys, iron, iron alloys, steel, stainless steel, hastelloy, inconel, duranickel, indium, indium alloys, gold, gold alloys, silver, silver alloys, copper, copper alloys, brass, nickel, nickel alloys, platinum, platinum alloys, palladium, palladium alloys, zinc, zinc alloys, cadmium and cadmium alloys.

In one embodiment, the extrusion material 16 can be drawn over an inner die 14. The outer surface of the internal die can have microfeatures which cause microstructures to be imparted on the inner surface of the extrusion material. In one embodiment, the extrusion material is a tube with a central cavity.

The extrusion material can be drawn in a manner which will reduce its diameter or its thickness or both after the extrusion material leaves contact with the die. In one embodiment, the extrusion material, having a cavity, can be drawn through drawings die 15 which will reduce the diameter of the out perimeter, the bore of the extrusion material or both.

In embodiments, one or more physical, mechanical or optical properties, other than and/or in addition to hydrophobicity, are established, varied and/or controlled by deforming a flexible substrate having a plurality of microfeatures disposed thereon. In an embodiment, for example, an optical property, such as the reflectivity, wavelength distribution of reflected or scattered light, transparency, wavelength distribution of transmitted light, refractive index or any combination of these, is controlled by flexing, bending, expanding, stretching and/or contracting the flexible substrate having a plurality of microfeatures disposed thereon. In an embodiment, a physical property, such as aerodynamic resistance or hydrodynamic resistance is controlled by flexing, bending, expanding, stretching and/or contracting the flexible substrate having a plurality of microfeatures disposed thereon. In an embodiment, a tactile property of the surface, such as the surface's tactile sensation, is controlled by flexing, bending, expanding, stretching and/or contracting the flexible substrate having a plurality of microfeatures disposed thereon.

FIG. 2 illustrates that microstructures can be imparted on a resulting part without necessarily changing the dimension of the resulting part from that of the extrusion material. Therefore, the negative microstructures on the die are imparted to the resulting part in generally a 1:1 ratio. When the resulting part dimensions are modified through the extrusion process, the ratio of size between the extrusion material and the resulting part can be up to 7:1 and greater. In one embodiment, shape of the resulting part produced from the die or mandrel can be preserved during the drawing, or the shape can change. The shape preservation or shape change can depend upon the properties of the extrusion material or how the extrusion material is subsequently processed.

When the diameter size of the extrusion material is changed after the microstructures are imparted on the resulting part, the microstructures on the part are changed. Therefore, the microstructures contained on the die are larger than that of the resulting microstructures on the resulting part to account for the shrinking of the resulting part from the extrusion material.

When the dimensions of the resulting part change from the extrusion material, one embodiment has the resulting contact angle of the microstructures on the die including in the range of 100 degrees to 120 degrees while the microstructures of the resulting part are between 101 degrees and 170 degrees. When the dimensions of the resulting part change is from the extrusion material, one embodiment has the resulting friction properties of the resulting part being 20 times less than the friction properties of the microstructures on the die. One embodiment has the resulting friction properties of the resulting part being 100 times more that the friction properties of the microstructure on the die. When the dimensions of the resulting part change from the extrusion material, one embodiment has the microstructures on the die on a scale of mm or μm while the microstructures on the resulting part will generally be in the scale of μm or nm.

Figure 4A:
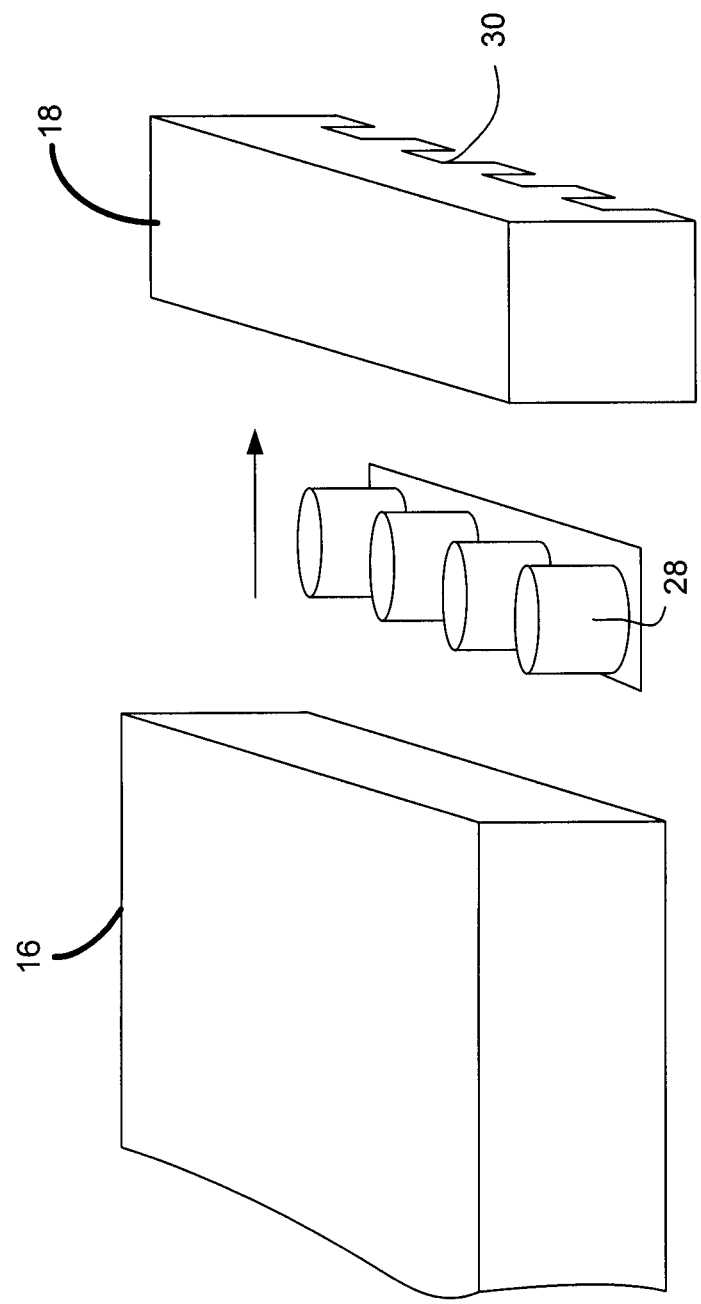
FIG. 4A is a perspective view of aspects of the invention.
Figure 4B:
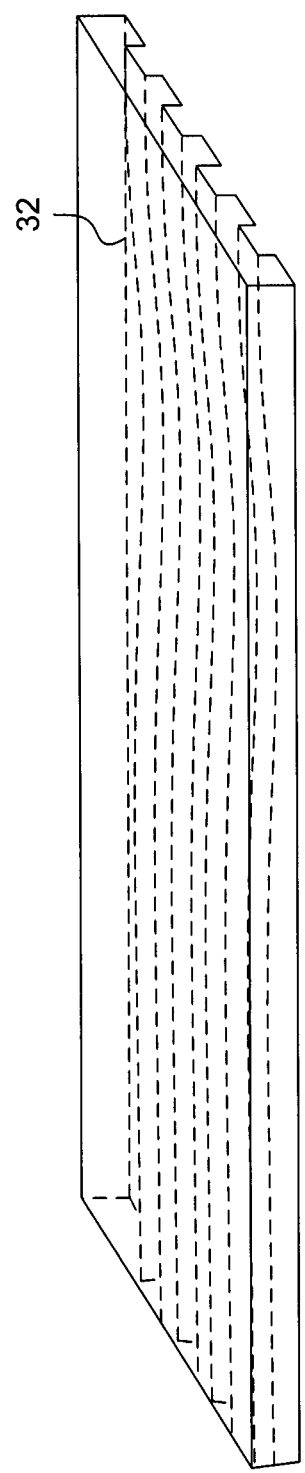
FIG. 4B is a portion of an extrudate resulting from the invention.
Figure 5A:
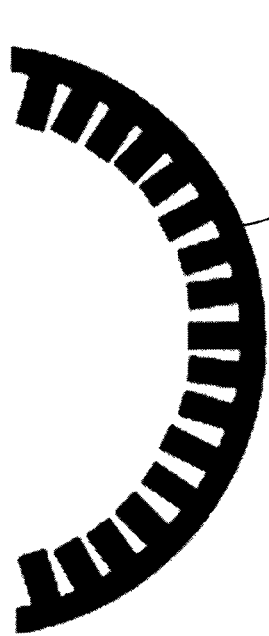
FIG. 5A through 5D are cross sections of portions of extrudate resulting from the invention.
Figure 5B:
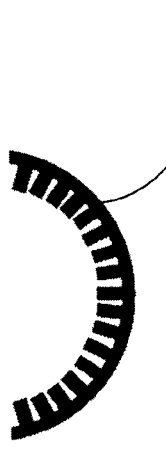
Figure 5C:
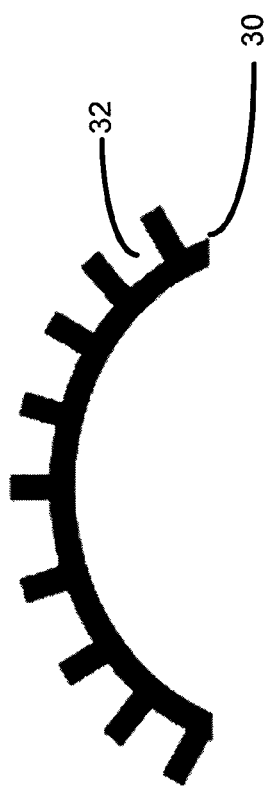
Figure 5D:
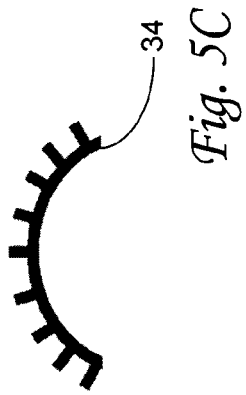

Referring to FIG. 3, the location of microstructures on the die can vary with the preferred embodiment placing the microstructures at location 26*a* as shown. Referring to FIG. 4, blank 16 can also be extruded with only a portion of the die having a negative of a microstructure shown as 28. When the extrusion material is forced across the die, the shape created by the interaction with the die imparts on the resulting part and can include microstructures. The blank can be manufactured into a resulting part through extrusion including drawing the blank through the die.

Referring to FIG. 5, outer surface of a resulting part is shown as 30 having a space 32 between the microstructures. When the extrusion material is drawn down the microstructures on the outer surface are modified, the microstructures themselves and the space between the microstructures is compressed as shown in drawn down resulting part 34. The same effect is realized with microstructures that are on the inner surface of the extrusion material as shown in extrusion inner surface 36 and drawn down extrusion inner surface 38.

Figure 6:
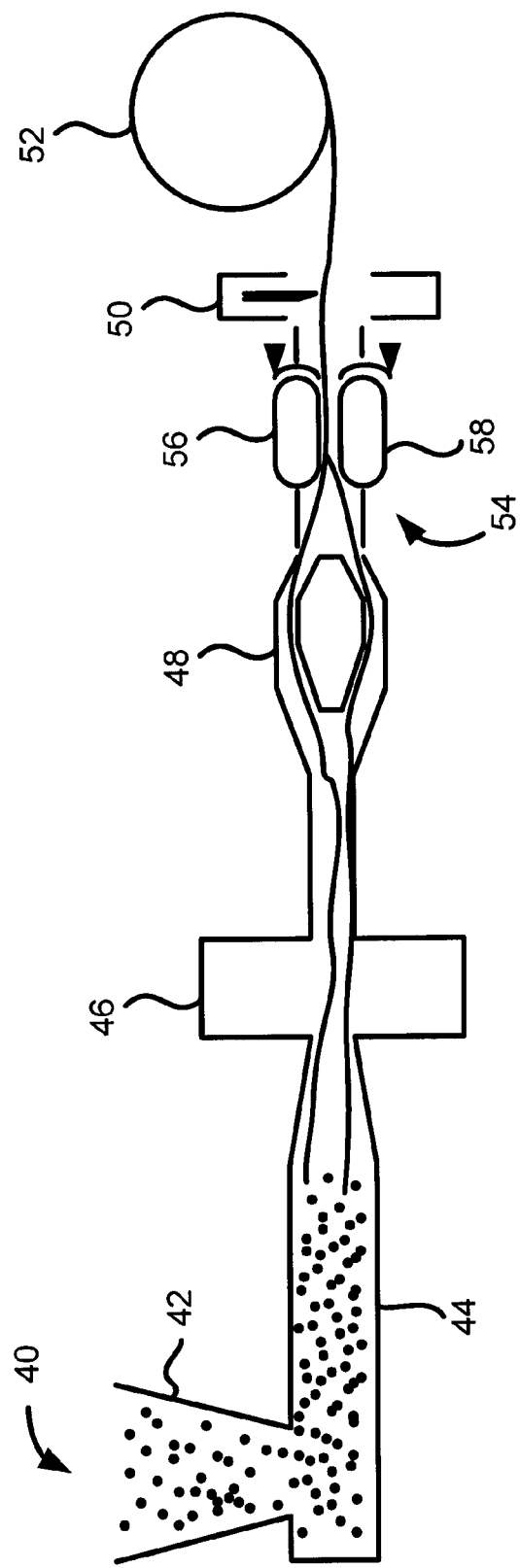
FIG. 6 is a schematic of aspects of the invention.

Referring to FIG. 6, the extrusion process is shown in further detail. Feed stock 40 is placed in hopper 42. The feed stock is then mixed and melted in extrusion chamber 44. The heated feed stock is pumped or otherwise drawn out of the extrusion chamber through a pump or gears 46 and forced through a dye, mandrel or both shown as 48. The extrudate produced by the dye or mandrel, having microstructures, can then be cooled by a cooling assembly 50 such as an air blower or quench bath, cut by cutter 52 or rolled on a spool 54. In the event that the spool rotates at a faster speed then the extrudate exits the die, the extrudate can be drawn to a smaller cross-section dimension.

It should be noted that there can be a plurality of quench baths using various quenching solutions. For example, when extruding aluminum, a quench bath of salt followed by a quench bath of water can be used. The temperature of the quench baths, the time between the extrudate exiting the dye and entering the quench bath and the length of time the extrudate is in the quench bath can vary.

In one embodiment, a puller 54 having an upper belt drive 56 and a lower belt drive 58 pulls the extrudate from the dye and into the cutter or toward the spool. With a puller, the extrudate can be drawn when the pull of the puller is greater than the extrusion rate of the extrudate from the dye. This results in the extrudate being stretched resulting in a smaller diameter extrudate. Additionally, the extrudate can also shrink when the extrudate is quenched and when the extrudate is rolled onto a spool.

Figure 7:
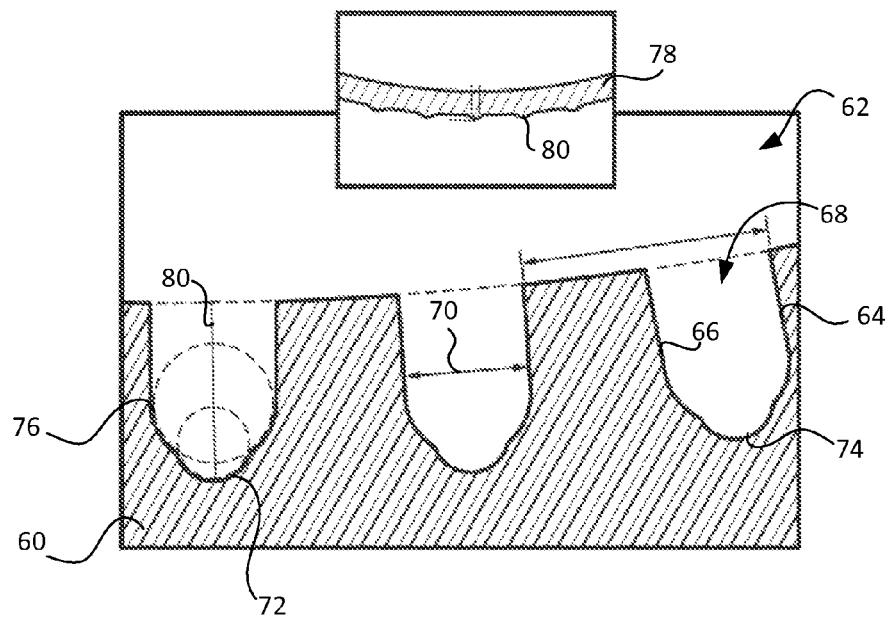
FIGS. 7 through 11 are elevation views of a portion of aspects of the invention.

Referring to FIG. 7, a portion of one microstructure of a circular die is shown. The die 60 includes a plurality of microfeatures 62 each having a first wall 64 and a second wall 66. A channel 68 is defined in the die having a width 70. A first arc 72 can be included in a lower surface 74. A second arc 76 can also be included in the lower surface overlapping the first arc. In use, the die can produce an extrudate 78 having microstructures 80. It should be noted that the extrudate microstructure is not a mirror image of the die microstructures as the extrudate microstructures have physical dimensions as the extrudate cools, is drawn or otherwise physically altered after the leaving the extrusion die. In one embodiment, the radius of the first arc is in the range of 45 to 65 μm. The channel width is in the range of 150 to 250 μm and the height 80 is in the range of 250 to 350 μm. The resulting extrudate microstructures can be between 7 and 13 μm in width and height can have generally a sloped peak configuration.

Figure 8:
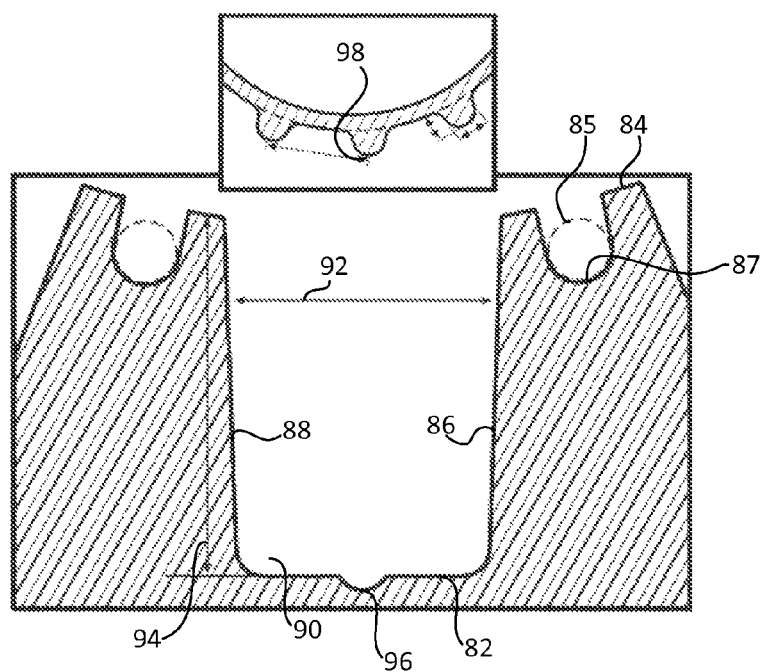

Referring to FIG. 8, another microstructure is shown. A lower surface 82 and an upper surface 84 are included in the die. A first wall 86 and second wall 88 can be included in the microstructure. An upper channel 85 can be defined on the upper surface. The upper channel can include a concave portion 87. A lower channel 90 can be defined in the microstructure having a width 92 and a height 94. An arc 94 can be defined in the lower surface. A second channel or arc 96 can be defined in the lower surface. In one embodiment, the lower channel height is in the range of 0.8 to 1.6 mm and the height is in the range of 1.0 to 2.0 mm. The resulting microstructures 98 on the extrudate can have a height in the range of 70 to 90 µm, a width in the range of 120 to 160 µm and can also have a general slope shape.

Figure 9:
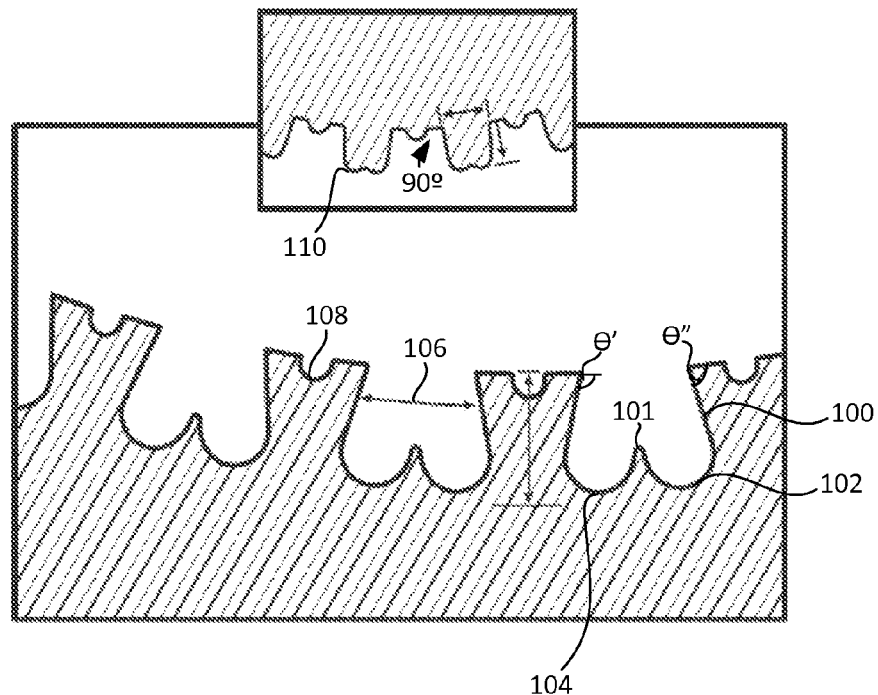

Referring to FIG. 9, another microstructure is shown. A first wall 100 is shown having an angle of incident θ' in relation to the upper surface less than 90° and an angle of incident θ" in relation to the upper surface greater than 90°. A first arc 102 can be included in the lower surface and a second arc 104 can be included in the lower surface adjacent to the first arc. A channel 106 defined in said die can have a width 106 that in one embodiment is in the range of 0.25 to 1.25 mm and a height in the range of 0.25 to 1.25 mm. This arrangement of the first wall, first arc, second arc and second wall is an overhang microstructure. A peak 101 can be disposed between the first and the second arc. During the extrusion process, the extrudate microstructure can shrink through drawings, cooling or other reason resulting in a extrudate microstructure that is generally smaller than the original mirror of the die microstructure. The height of the resulting extrudate microstructure 110 can be in the range of 20 to 60 µm and have a width of between 100 and 140 µm. A upper arc 108 can be included in the upper surface. A wall angle of the extrudate can be at least 90° in relation to the base of the slllar of the microstructure.

Figure 10:
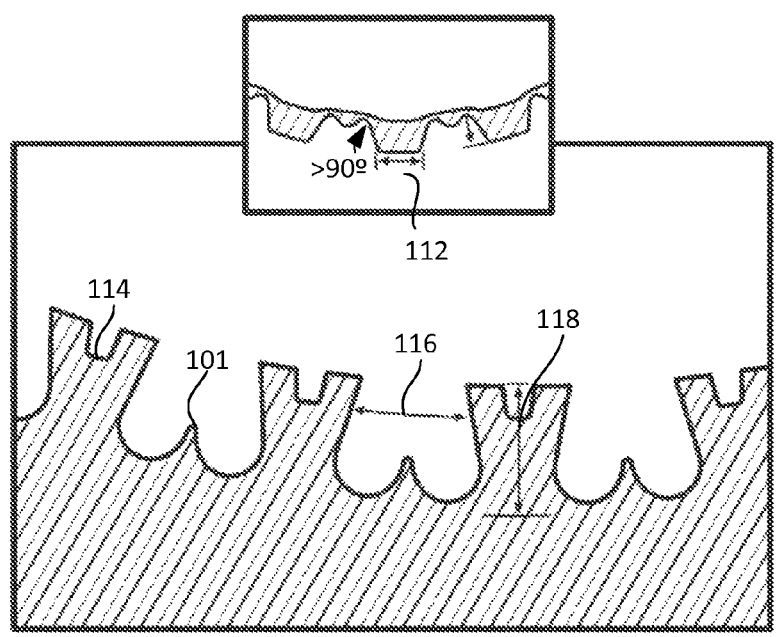

In one embodiment, the sides of the resulting extrudate microstructure are generally vertical. In another embodiment, the walls can be slanted as shown in FIG. 10. The slanted walls can result from a nylon extrudate manufactured with a line speed of 200 feet per second, drawn down about 3.2 times and cooled with a water quench bath. The width 112 of the extrudate can be in the range of 150 to 250 µm and the height can be in the range of 150 to 250 µm. A wall angle of the extrudate can be at least 90° in relation to the base of the pillar of the microstructure. A channel 114 can be included in the upper surface of the die and can have three sides of a generally trapezoidal shape. The resulting extrudate microstructure could be a generally round microfeature included on the extrudate. The microstructure can have a width in the range of 1000 to 1400 µm and a height in the range of 500 to 1000 µm. The resulting extrudate can have a height in the range of 90 to 210 µm and a width in the range of 100 to 380 µm. A wall angle of the extrudate can be at least 90° in relation to the base of he pillar of the microstructure.

Figure 11:
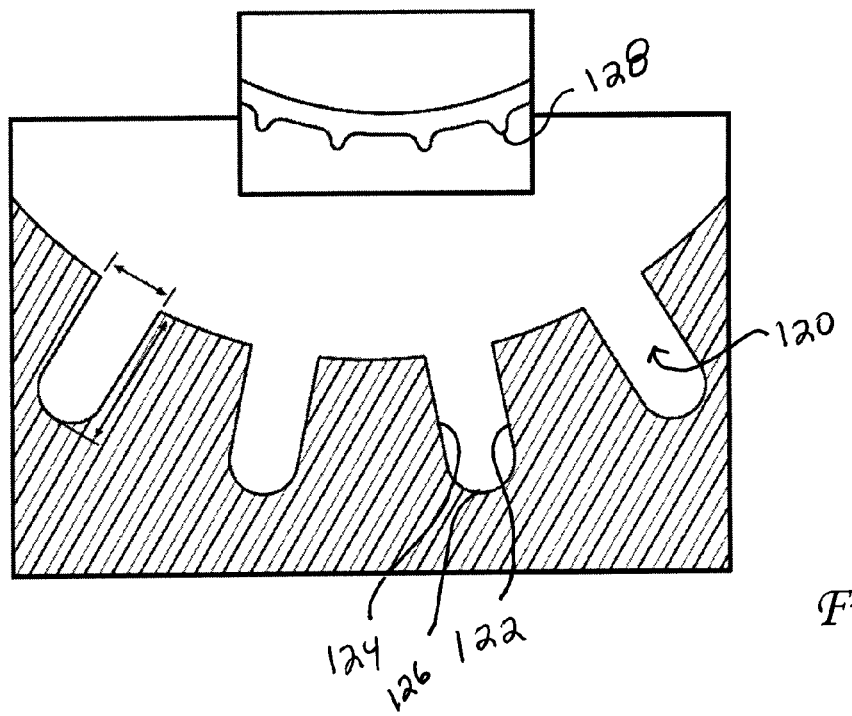

Referring to FIG. 11, a channel 120 can have a first wall 122, a second wall 124 and a arc 126 disposed at the lower surface and between the first and second wall. The channel can have a width in the range of 100 to 140 µm and a height in the range of 200 to 360 µm. The resulting extrudate microstructure 128 can have a height between 45 to 60 µm and a width of 40 to 50 µm.

Figure 12:
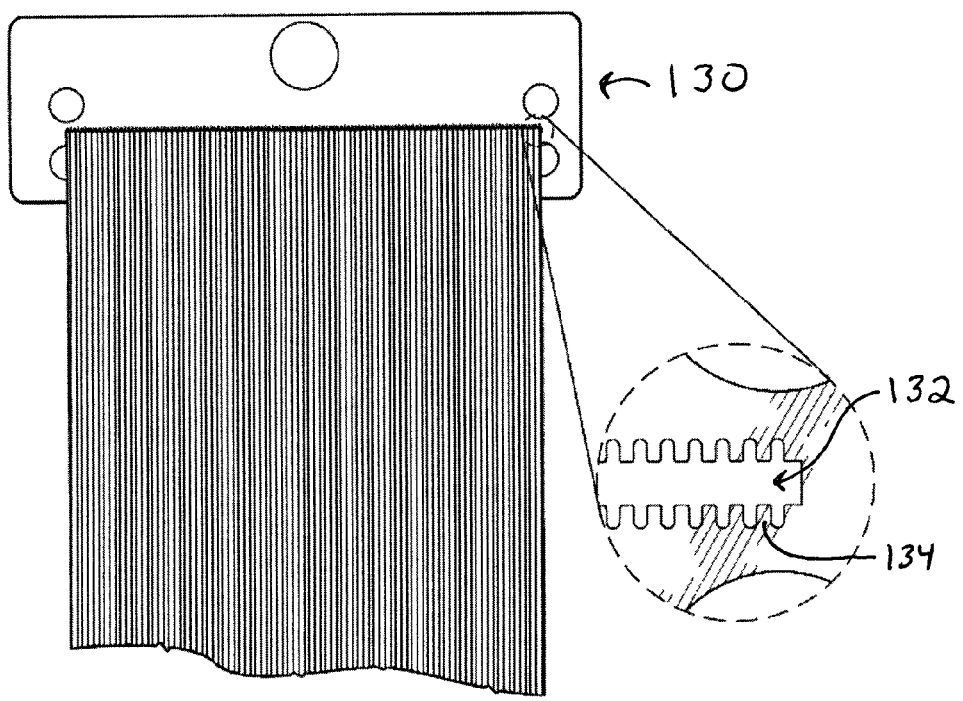
FIG. 12 is a schematic of aspects of the invention.
Figure 13:
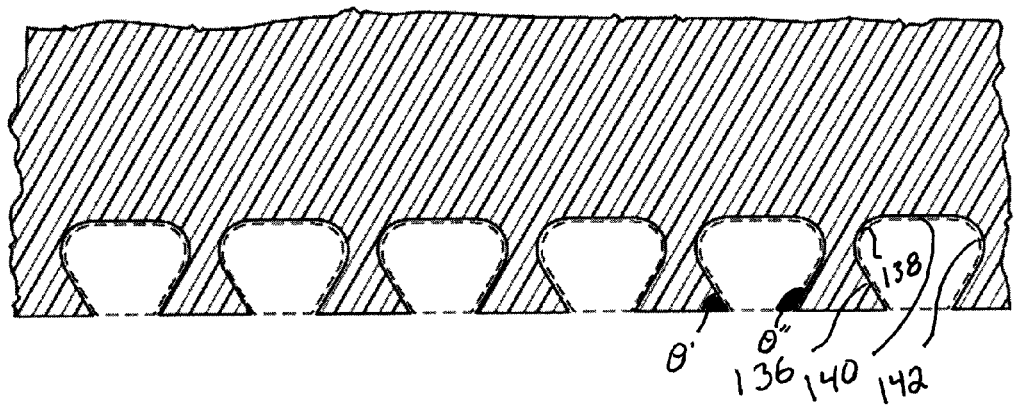
FIG. 13 is an elevation view of a portion of aspects of the invention.
Figure 14:
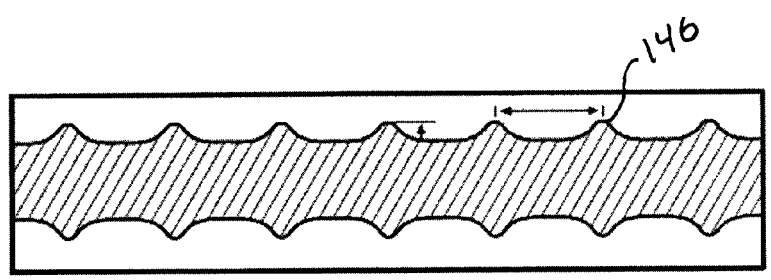
FIG. 14 is a cross section of extrudate resulting from the invention.

Referring to FIGS. 12 and 13, an extrusion die 130 includes an opening 132 having microstructures. As shown, the die is a flat die that can include one or more parts. Microstructures 134 are disposed along the interior surface of the die. In one embodiment, a first wall 136 has an angle of incident θ' that is less than 90°, a first arc 138 adjacent to the first wall, a planar portion 140, a second arc 142 and a second wall 144 having an angle of incident θ" greater than 90°. The resulting extrudate, shown in FIG. 14, is a film or otherwise flat extrudate having microstructures 146 which are generally in the range of 200 to 240 µm apart with a height in the range of 30 to 40 µm.

Referring to FIG. 15A, a circular die 150 is shown having microstructures 152 disposed along an inner surface of the die. Referring to FIG. 15B, one embodiment of the microstructure is shown. Opening 154 is defined in the die with microstructure 156 surrounding the opening. The microstructures define a first arc 158 and a second arc 160 in an alternating pattern wherein the depth of the first arc is greater than the depth of the second arc.

Referring to FIG. 16A, another microstructure for a circular die is shown. The microstructure includes a first wall 162 having an angle of incident θ' in relation to the upper surface of less than 90° and a second wall 164 having an angle of incident θ" in relation to the upper surface of greater than 90°. A first arc 166 can be included in said microstructure adjacent to a second arc 168. A lower planar surface 170 can in included in the microstructure and disposed between the first and second arc. An upper cavity 172 can be included in said upper surface and can be arranged in an alternating pattern in said microstructure.

Figure 17:
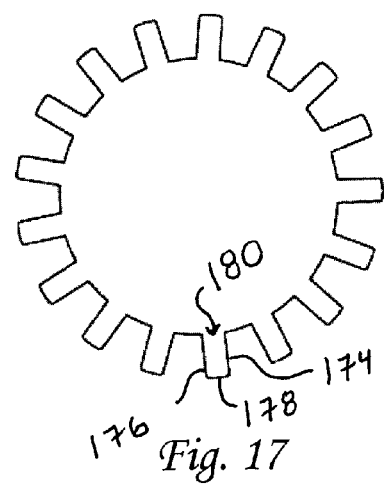
FIG. 17 is a cross section of aspects of the invention.
Figure 18:
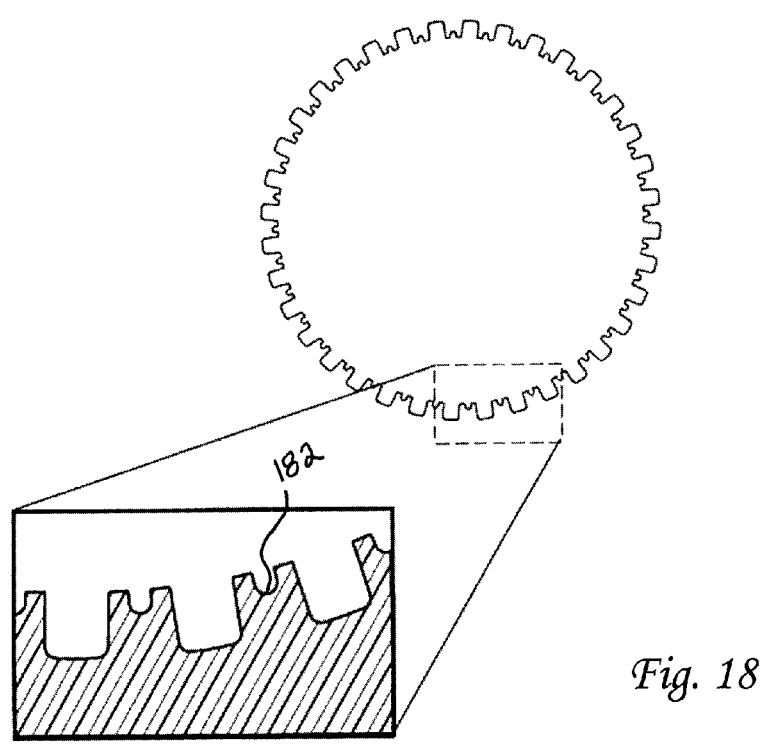
FIGS. 18 through 20 are cross sections and enlargements of portions of the cross sections of aspects of the invention.
Figure 19:
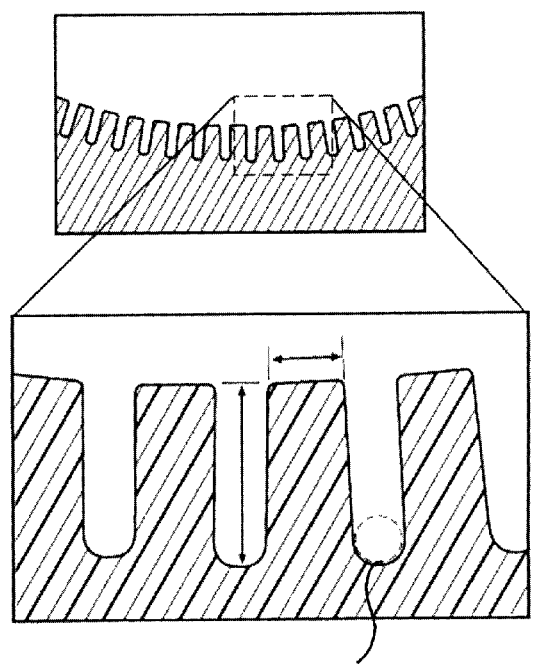

Referring to FIG. 17, another microstructure for a circular die is shown having a first wall 174 and a second wall 176 defining a cavity 180 having a lower planar surface 178. In one embodiment, the first and second wall have a height in the range of 400 to 480 µm and a width in the range of 360 to 380 µm. FIG. 18 shows a upper arc 182 defined in the upper surface. In one embodiment, the upper arc has a width in the range of 100 to 160 µm and a depth in the range of 100 to 160 µm. FIG. 19 shows a lower arc 184 defined in the lower surface.

Figure 20:
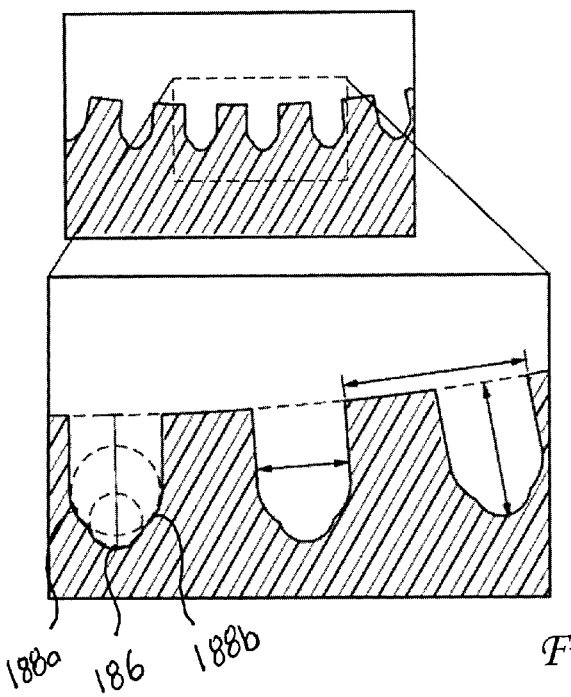

Referring to FIG. 20, another microstructure is shown having a first wall and a second wall defining a cavity. A first arc 186 is defined in the lower surface and in the cavity. A pair of arcs 188a and 188b are defined in the walls of the cavity.

Figure 21B:
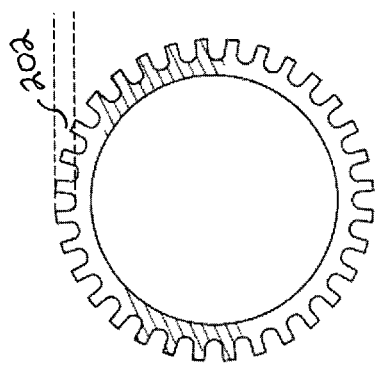
FIG. 21B is a cross section of aspects of the invention.
Figure 21A:
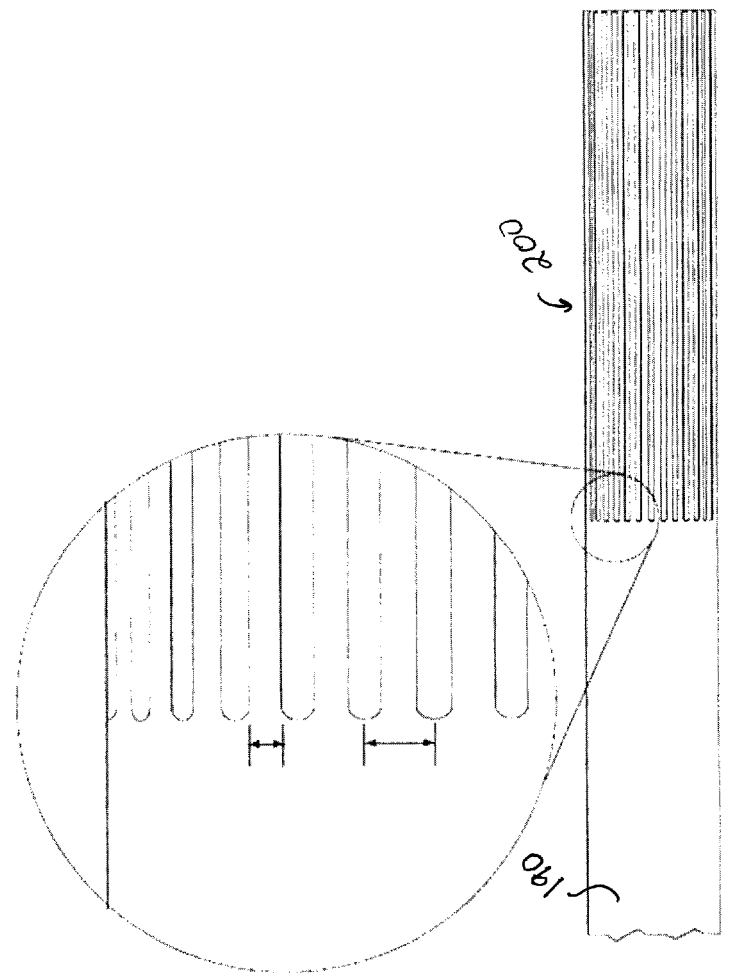
FIG. 21A is a side view of an aspect of the invention with an enlargement of a portion of the side view.

FIG. 21 shows a mandrel 190 having microstructures 200 so that an extrudate made using the mandrel would have microstructures formed on the inner surface of the extrudate. FIG. 22 shows that the microstructures of the mandrel have a height 202.

Figures 22A, 22B:
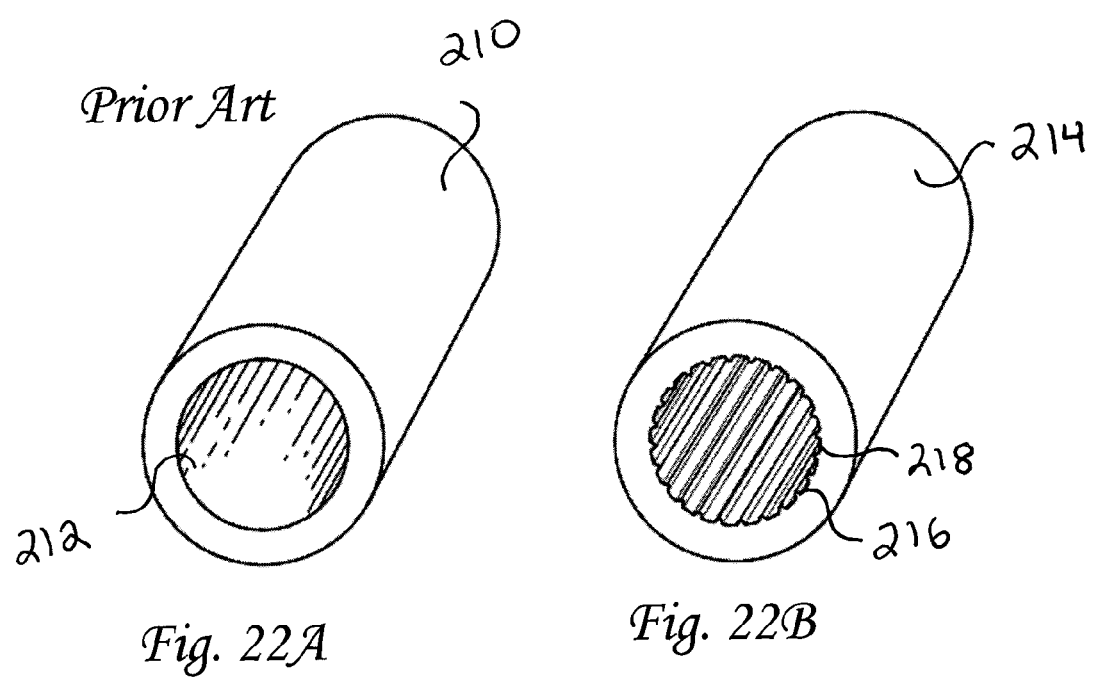
FIG. 22A is a perspective view of the prior art.
FIG. 22B is a perspective view of the resulting extrudate of the invention.
Figures 22C, 22D:
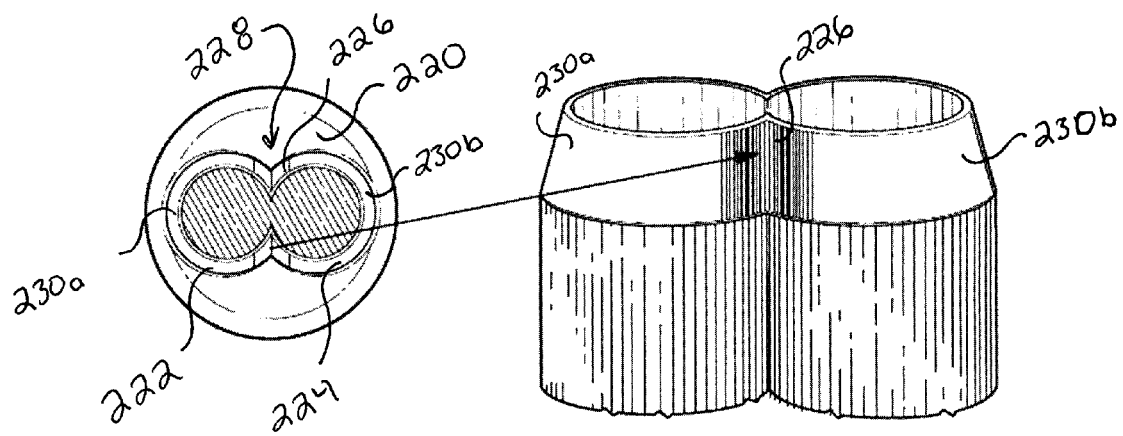
FIG. 22C is a front view of an aspect of the invention.
FIG. 22D is a perspective view of aspects of the invention.
Figure 22E:
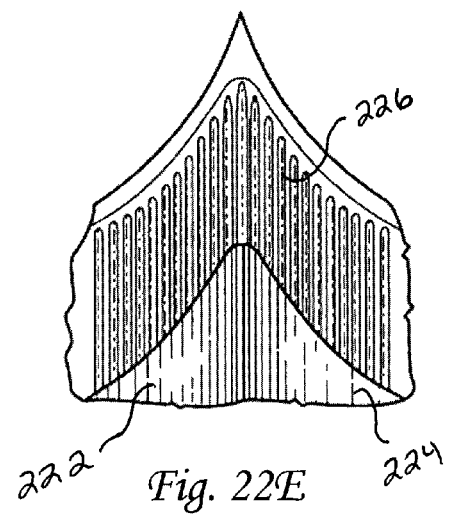
FIG. 22E is a top view of aspects of the invention.

FIG. 22A shows an extrudate 210 manufactured with a mandrel that does not include microstructures. The inner surface 212 is smooth resulting from a mandrel that does not include microstructures. FIG. 22B, however, shows an extrudate 214 having microstructures 216 that are formed on the inner surface 218 by a mandrel which includes microstructures. FIG. 22C shows a mandrel 220 in one embodiment having a first circular portion 222 and a second circular portion 224 that are adjacent to each other. Microstructures 226 are located at the junction 228 between the circular portions. Smooth portion 230a and 230b are located on the respective circular portions as shown in FIG. 22D.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:
1. A manufacturing apparatus for manufacturing extruded parts having microstructures comprising:
   a support structure;
   a hopper carried by said support structure for receiving feedstock;

an extrusion chamber operatively associated with said hopper for receiving said feedstock from said hopper and melting said feedstock above a feedstock melting temperature;

a die carried by said support structure having die microstructures disposed on an inner surface of said die, said die microstructures having a plurality of microfeatures each having an upper surface and a lower surface, said lower surface having an arc defined in said lower surface, said melted feedstock being forced through said die to produce a pre-cooled extrudate having pre-cooled extrudate microstructures;

an upper channel defined in said upper surface including a concave portion;

a cooling assembly wherein said extrudate microstructures of said pre-cooled extrudate have larger physical dimensions than that of post-cooled extrudate microstructures of a post-cooled extrudate wherein said post-cooled extrudate microstructures has a height in the range of 70 to 90 μm, a width in the range of 120 to 160 μm and a general slope shape.

2. The manufacturing apparatus of claim 1 wherein said extrudate has a physical shape taken from the group consisting of a film, a square column, rectangular column, trapezoidal column, asymmetrical column, circular column, oval column, triangular column and any combination of these.

3. The manufacturing apparatus of claim 1 including a take up roller for gathering said post-cooled extrudate wherein said extrudate microstructures of said pre-gathered extrudate have larger physical dimensions than that of said extrudate microstructures of said gathered extrudate.

4. The manufacturing apparatus of claim 1 including:
a post extrusion assembly for physically altering said extrudate in a manner taken from the group consisting of: drawing down, flattening, stretching, embossing, coating, stamping, rolling, spiraling, heating, freezing and any combination of these; and,
wherein said extrudate microstructures of said extrudate have larger physical dimensions than that of said extrudate microstructures of said extrudate after said extrudate passes through said post extrusion assembly.

5. The manufacturing apparatus of claim 1 including:
a die having a planar surface;
a first wall included in at least one microfeature disposed on said planar surface having an angle of incident less than 90° in relation to said upper surface; and,
an arc included in said microfeature disposed adjacent to said first wall.

6. The manufacturing apparatus of claim 5 including:
a microfeature planar surface included in said microfeature disposed along said lower surface;
a second arc included in said microfeature disposed adjacent to said microfeature planar surface; and,
a second wall included in microfeature having an angle of incident greater than 90° in relation to said upper surface whereas the resulting extrudate microstructures have a height in the range of 150 to 250 μm, a width in the range of 150 to 250 μm and a general pillar shape.

7. The manufacturing apparatus of claim 1 including a lower channel defined by said microfeature having a width between 100 and 160 μm.

8. The manufacturing apparatus of claim 1 including a lower channel defined by said microfeature having a depth between 300 and 400 μm.

9. The manufacturing apparatus of claim 1 including:
a curved surface included in said die having microfeatures;
a lower channel defined in at least one microfeature included in said curved surface; and,
a second arc defined in said lower surface of said microfeature included in said curved surface.

10. The manufacturing apparatus of claim 9 wherein said second arc is disposed adjacent to said arc.

11. The manufacturing apparatus of claim 9 including a first wall included in said microfeature having an angle of incident less than 90° in relation to said upper surface.

12. The manufacturing apparatus of claim 11 including a second wall included in said microfeature having an angle of incident less than 90° in relation to said upper surface.

13. The manufacturing apparatus of claim 9 including a first wall included in said microfeature having an angle of incident greater than 90° in relation to said upper surface.

14. The manufacturing apparatus of claim 1 including a mandrel carried by said support structure having microstructures deposed on an outer surface so that said extrudate will include an interior cavity having microstructures on an inner surface of said interior cavity.

15. The manufacturing apparatus of claim 1 wherein said extrudate microstructures have dimensions in the range of 0.1 and 500 μm.

16. The manufacturing apparatus of claim 1 wherein said extrudate microstructures include physical characteristics selected from the group consisting of: hydrophobicity, self-cleaning, increased hydro-dynamic drag coefficients, decreased or increased aerodynamic drag coefficients, increased friction, reduced friction, optical effects, increased adhesion, decreased adhesion, oleophobicity, tactile effects, anti-blocking and any combination of these.

17. The manufacturing apparatus of claim 1 wherein said extrudate microstructures are selected from the group consisting of: pillars, voids, steps, ridges, curved regions, recessed regions, columns, cross-section shapes comprising circles, ellipses, triangles, squares, rectangles, poly ions, stars, hexagons, letters, numbers, symbols, and any combination of these.

18. The manufacturing apparatus of claim 1 including an overhang structure included in said die microstructures.

19. A manufacturing apparatus for manufacturing extruded parts having microstructures comprising:
a support structure;
an extrusion chamber carried by said support structure for receiving feedstock and melting said feedstock above a feedstock melting temperature; and,
a die carried by said support structure having die microstructures disposed on an inner surface of said die, said die microstructures having a plurality of microfeatures each having an upper surface and a lower surface;
a lower channel included in said die having walls having an interior angles of incident in relation to the upper surface less than 90°, a width having a range of between 0.25 to 1.25 mm and a height having a range of 0.25 to 1.25 mm;
said melted feedstock being forced through said die to produce an extrudate having extrudate microstructures; and,
whereas the resulting extrudate microstructures have a wall angle at least 90° and have a general pillar shaped cross-section.

20. A manufacturing apparatus for manufacturing extruded parts having microstructures comprising:
a die body;
an opening defined in said die body having an inner surface;
a plurality of die microstructures disposed on said inner surface of said die body, said die microstructures having a plurality of microfeatures each having an upper surface and a lower surface, said microstructures each include a first wall having an angle of incident of less than 90° in relation to said upper surface, a first arc defined in said lower surface adjacent to a second arc defined in said lower surface and a peak disposed between said first and said second arc;

an upper cavity defined in said upper surface; and, said die microstructures and said upper cavity are arranged around the die in an alternating pattern so that said extrude part include a physical property taken from the group consisting of: hydrophobicity, decreased aerodynamic drag coefficients, reduced friction, decreased adhesion, and oleophobicity.

21. The manufacturing apparatus of claim 20 including:

a microfeature planar surface included in said microfeature disposed between said first and said second arc.

22. The manufacturing apparatus of claim 20 including a channel defined by said microfeature having a width between 100 and 160 μm.

23. The manufacturing apparatus of claim 20 including a channel defined by said microfeature having a depth between 300 and 400 μm.

24. The manufacturing apparatus of claim 20 including:

a curved surface included in said die.

25. The apparatus of claim 19 including a peak defined on said lower surface of said microfeatures and said microstructure of said peak includes a general flat summit providing physical characteristics of said microstructures on said extrudate selected from the group consisting of: hydrophobicity, decreased aerodynamic drag coefficients, reduced friction, decreased adhesion, oleophobicity, and any combination of these.

26. The apparatus of claim 19 including a peak defined on said lower surface of said microfeatures and said microstructure of said peak includes a general flat summit having a summit indention providing physical characteristics of said microstructures on said extrudate selected from the group consisting of: hydrophobicity, decreased aerodynamic drag coefficients, reduced friction, decreased adhesion, oleophobicity, and any combination of these.

* * * * *